United States Patent
Lee et al.

(10) Patent No.: US 12,392,814 B2
(45) Date of Patent: Aug. 19, 2025

(54) TEG CIRCUIT, SEMICONDUCTOR DEVICE, AND TEST METHOD OF THE TEG CIRCUIT

(71) Applicant: Samsung Electronics Co., Ltd., Suwon-si (KR)

(72) Inventors: Cheongwon Lee, Suwon-si (KR); Gyosoo Choo, Suwon-si (KR); Youngwoo Park, Suwon-si (KR); Seunghoon Lee, Suwon-si (KR); Jinwoo Choi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 190 days.

(21) Appl. No.: 18/454,404

(22) Filed: Aug. 23, 2023

(65) Prior Publication Data

US 2024/0125841 A1   Apr. 18, 2024

(30) Foreign Application Priority Data

Oct. 14, 2022 (KR) .......................... 10-2022-0132566

(51) Int. Cl.
*G01R 31/26* (2020.01)
(52) U.S. Cl.
CPC ................................ *G01R 31/2607* (2013.01)
(58) Field of Classification Search
CPC ............ G01R 31/2607; G01R 31/2621; G01R 31/31712; G01R 19/10; G01R 19/16571; G01R 31/26; G01R 31/275; G01R 31/28; G01R 31/2879; G01R 31/3183
See application file for complete search history.

(56) References Cited

U.S. PATENT DOCUMENTS

| | | | | |
|---|---|---|---|---|
| 6,049,213 | A * | 4/2000 | Abadeer | G01R 31/2879 324/719 |
| 7,408,371 | B2 * | 8/2008 | Kim | G01R 31/31937 368/107 |
| 8,779,796 | B2 | 7/2014 | Luo et al. | |
| 9,057,758 | B2 * | 6/2015 | Kato | G01R 31/275 |
| 10,761,130 | B1 * | 9/2020 | van der Wagt | G01R 31/2601 |
| 10,809,285 | B2 * | 10/2020 | Akahane | G01R 19/16571 |
| 11,175,332 | B2 | 11/2021 | Nakamura et al. | |
| 12,210,059 | B2 * | 1/2025 | Kim | G01R 31/318511 |

FOREIGN PATENT DOCUMENTS

| | | |
|---|---|---|
| JP | H07333292 A | 12/1995 |
| JP | 3086325 B2 | 9/2000 |
| JP | 2003149286 A | 5/2003 |
| JP | 2009109237 A | 5/2009 |
| KR | 19990057062 A | 7/1999 |

* cited by examiner

*Primary Examiner* — Vinh P Nguyen
(74) *Attorney, Agent, or Firm* — Wolf, Greenfield & Sacks, P.C.

(57) ABSTRACT

An embodiment provides a test element group (TEG) circuit, including: a first pad configured for a test voltage to be applied; an amplifier including a first input terminal connected to the first pad, a second input terminal connected to a first terminal of a test transistor, and an output terminal electrically connected to the second input terminal; a variable resistor including one terminal connected to the output terminal of the amplifier and the other terminal connected to the first terminal of the test transistor; and a gate driving circuit that supplies a gate voltage to a gate of the test transistor.

20 Claims, 12 Drawing Sheets

US 12,392,814 B2

TEG CIRCUIT, SEMICONDUCTOR DEVICE, AND TEST METHOD OF THE TEG CIRCUIT

CROSS-REFERENCE TO RELATED APPLICATION

This application claims priority to and the benefit of Korean Patent Application No. 10-2022-0132566 filed in the Korean Intellectual Property Office on Oct. 14, 2022, the entire contents of which are incorporated herein by reference.

BACKGROUND

(a) Field

The present disclosure relates to a test element group (TEG) circuit, a semiconductor device including the TEG circuit, and a test method of the TEG circuit.

(b) Description of the Related Art

Unlike an off-chip, it is difficult to directly apply an accurate voltage to a drain, a gate, a source, and a body of a transistor in an on-chip. Particularly, in order to measure electrical characteristics of a transistor in an on-chip structure, a drain voltage must be accurately controlled, so in the on-chip structure, a separate circuit for accurately applying the drain voltage is required. For example, there is a prior art that requires a digital analog converter (DAC) that generates a voltage to be applied to a drain based on a digital code and an analog digital converter (ADC) that converts a test result into a digital code, and the DAC and the ADC increase a size and complexity of an on-chip to be tested. When the number of input/output bits of the DAC and the ADC is reduced in order to reduce areas of the DAC and the ADC, resolution may increase in generating a drain voltage and measuring a test result, resulting in decreased accuracy.

The above information disclosed in this Background section is only for enhancement of understanding of the background of the invention, and therefore it may contain information that does not form the prior art that is already known in this country to a person of ordinary skill in the art.

SUMMARY

The present invention has been made in an effort to provide a TEG circuit, a semiconductor device, and a test method of the TEG circuit that may accurately control a drain voltage of a test transistor, and may improve threshold voltage and saturation current measurement accuracy for an on-chip transistor.

An embodiment of the present invention provides a test element group (TEG) circuit, including: a first pad configured to receive an applied test voltage; an amplifier including a first input terminal connected to the first pad, a second input terminal connected to a first terminal of a test transistor, and an output terminal operatively coupled to the second input terminal; a variable resistor including a first terminal connected to the output terminal of the amplifier and a second terminal connected to the first terminal of the test transistor; and a gate driving circuit that supplies a gate voltage to a gate of the test transistor.

The TEG circuit may further include: a second pad; a first switch connected between the first terminal of the variable resistor and the second pad; and a second switch connected between the second terminal of the variable resistor and the second pad.

During a period in which the test voltage is applied to the first pad, a difference between a first voltage measured through the second pad when the first switch is turned on and a second voltage measured through the second pad when the second switch is turned on may depend on a current flowing through the test transistor.

When a current value obtained by dividing the difference between the first voltage and the second voltage by a resistance value of the variable resistor is equal to or greater than a predetermined reference value due to the change of the gate voltage changed by the gate driving circuit, the gate voltage may be a threshold voltage of the test transistor.

When a test voltage of a predetermined level is applied to the first pad and the gate driving circuit supplies the gate voltage of the same level as the test voltage of the predetermined level to the gate of the test transistor, a current value obtained by dividing the difference between the first voltage and the second voltage by a resistance value of the variable resistor may be indicative of a saturated current of the test transistor.

The variable resistor may include: a plurality of resistors; and a plurality of switches connected in series respectively corresponding to the plurality of resistors. Among the plurality of resistors, a switch connected to a selected resistor may be turned on based on an amount of the saturated current of the test transistor.

The TEG circuit may further include a connection switch connected between the first pad and the gate of the test transistor. When the saturated current for the test transistor is measured, the connection switch may be turned on, and the gate driving circuit may not supply the gate voltage.

The TEG circuit may further include a connection switch connected between the second input terminal of the amplifier and the gate of the test transistor. When the saturated current for the test transistor is measured, the connection switch may be turned on, and the gate driving circuit may not supply the gate voltage; that is, the gate driving circuit may be disabled.

The gate driving circuit may include: a plurality of resistors connected in series between a power voltage and a ground; and a plurality of selection switches connected between a plurality of nodes at which two adjacent resistors of the plurality of resistors are connected and the gate of the test transistor.

The TEG circuit may further include: a first pin connected to the first pad; a second pin connected to the second pad; a first electrostatic discharge (ESD) element connected between the first pad and the ground; and a second ESD element connected between the second pad and the ground.

Another embodiment of the present invention provides a semiconductor device including: a plurality of test transistors; a first pad configured to receive an applied test voltage; an amplifier including a first input terminal connected to the first pad, a second input terminal, and an output terminal; a variable resistor including a first terminal connected to the output terminal of the amplifier; a multiplexer selectively connecting a first terminal of a first test transistor of the plurality of test transistors and the second input terminal of the amplifier, and selectively connecting the first terminal of the first test transistor and a second terminal of the variable resistor; and a gate driving circuit supplying a gate voltage to gates of the plurality of test transistors.

The multiplexer may include: a plurality of first selection switches connected between a plurality of first terminals of the plurality of test transistors and the second input terminal of the amplifier; and a plurality of second selection switches connected between the plurality of first terminals of the plurality of test transistors and the second terminal of the variable resistor.

The semiconductor device may turn on a first selection switch connected to the first terminal of the first test transistor among the plurality of first selection switches, and may turn on a second selection switch connected to the first test transistor among the plurality of second selection switches.

The variable resistor may include: a plurality of resistors; and a plurality of switches connected in series respectively corresponding to the plurality of resistors. The semiconductor device may determine a first resistor of the plurality of resistors based on an amount of a saturated current of the first test transistor, and may turn on a switch of the plurality of switches connected to the first resistor.

The gate driving circuit may include: a plurality of resistors connected in series between a power voltage and a ground; and a plurality of selection switches connected between a plurality of nodes at which two adjacent resistors of the plurality of resistors are connected and the gates of the plurality of test transistors.

The gate driving circuit may control the plurality of selection switches to change the gate voltage, in order to measure a threshold voltage of the first test transistor.

The gate driving circuit may supply the gate voltage that is the same as the test voltage to measure the saturated current of the first test transistor.

Another embodiment of the present invention provides a test method of a TEG circuit, wherein the TEG circuit includes an amplifier including a first input terminal connected to a first pad, a second input terminal connected to a first terminal of a test transistor, and an output terminal connected to the second input terminal through a variable resistor, the method including: supplying a test voltage to the first pad; supplying a gate voltage to a gate of the test transistor; measuring a voltage of a first terminal of the variable resistor connected to the output terminal of the amplifier; measuring a voltage of a second terminal of the variable resistor connected to the second input terminal of the amplifier; and calculating a current value flowing through the test transistor by dividing a difference between the voltage of the first terminal of the variable resistor and the voltage of the second terminal of the variable resistor by a resistance value of the variable resistor.

The test method of the TEG circuit may further include: determining whether the calculated current value is greater than or equal to a predetermined reference value; controlling the TEG circuit to increase the gate voltage when the calculated current value is less than the reference value as a result of the determining; and determining the gate voltage of the test transistor as a threshold voltage of the test transistor when the calculated current value is equal to or greater than the reference value as a result of the determining.

The test method of the TEG circuit may further include measuring a saturation current of the test transistor by calculating a current value flowing through the test transistor when the gate voltage is the same as the test voltage.

DETAILED DESCRIPTION OF THE EMBODIMENTS

Figure 1:
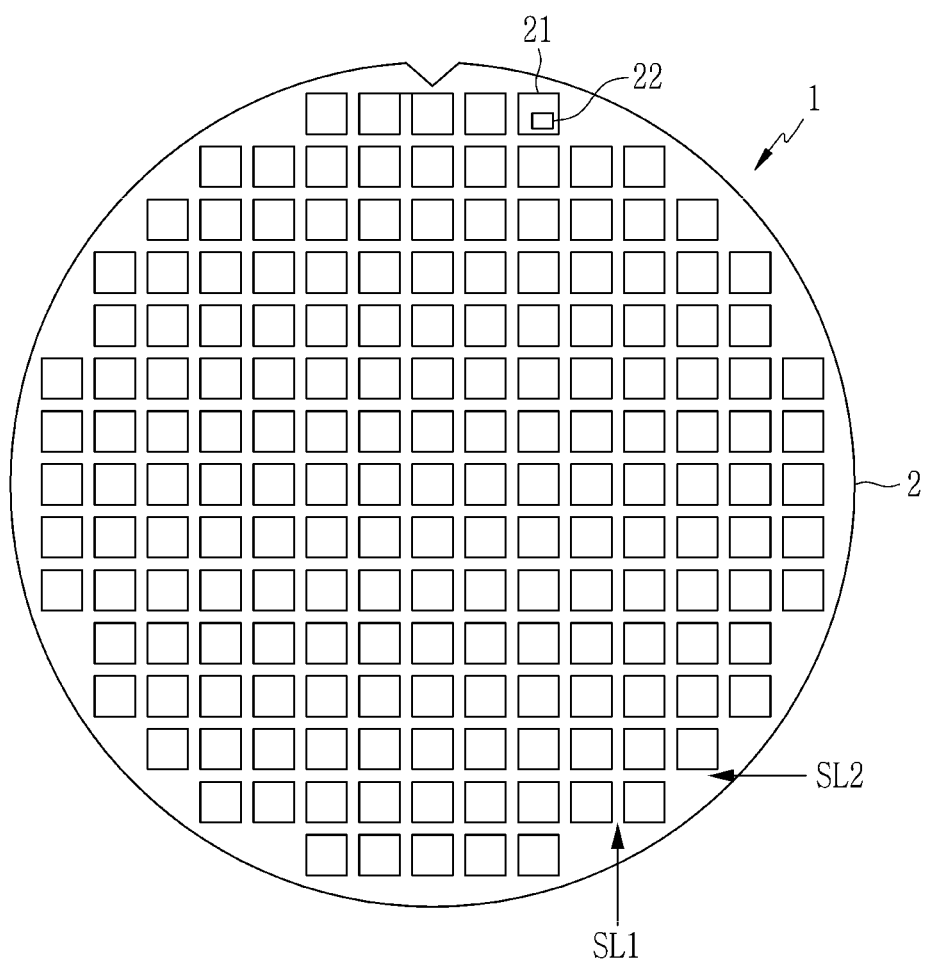
FIG. 1 illustrates a semiconductor device according to an embodiment of the present invention.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

Accordingly, the drawings and description are to be regarded as illustrative in nature and not restrictive. Like reference numerals, where used, designate like elements throughout the drawings and specification. In the flowcharts described with reference to the drawings in this specification, the operation order may be changed, various operations may be merged, certain operations may be divided, and certain operations may not be performed.

In addition, a singular form may be intended to include a plural form as well, unless the explicit expression such as "one" or "single" is used. Terms including ordinal numbers such as first, second, and the like will be used only to describe various constituent elements, and are not to be interpreted as limiting these constituent elements. These terms may be used for a purpose of distinguishing one constituent element from other constituent elements.

FIG. 1 illustrates a semiconductor device according to an embodiment of the present invention.

A semiconductor device 1 may include a plurality of semiconductor chips 21 implemented on a wafer 2, and at least one of the plurality of semiconductor chips 21 may include a test element group (TEG) circuit 22. The TEG circuit 22 may be formed and positioned inside the semiconductor chip 21. Shapes of the circular wafer 2 and the rectangular semiconductor chip 21 shown in FIG. 1 are examples for describing the embodiment, and the present invention is not limited thereto.

The plurality of semiconductor chips 21 are arranged in a matrix form on the wafer 2, a plurality of scribe lanes SL1 extending in a first direction and a plurality of scribe lanes SL2 extending in a second direction crossing the first direction are positioned in an area between the plurality of semiconductor chips 21, and the plurality of semiconductor chips 21 may be divided by the plurality of scribe lanes SL1 and SL2. Although the scribe lanes SL1, SL2 are shown as being perpendicular to one another, embodiments of the invention are not limited thereto. The plurality of scribe lanes SL1 and SL2 may provide a separation area for separating the plurality of semiconductor chips 21 from each other during an individualization process (e.g., dicing).

The plurality of semiconductor chips 21 may be memory chips or non-memory chips. The TEG circuit 22 may include a plurality of test transistors of various types configuring the semiconductor chip 21. The TEG circuit 22 may include at least some of a plurality of types of a plurality of transistors configuring each of the plurality of semiconductor chips 21 implemented in an on-chip form on the wafer 1. By using the TEG circuit 22, electrical characteristics of the plurality of test transistors, for example, a threshold voltage, a saturated current, and the like, may be measured. The TEG circuit 22 may include an amplifier for measuring an electrical characteristic of the plurality of test transistors, a variable resistor, a gate driving circuit, a TEG control circuit, and a plurality of pads. In the TEG circuit 22, at least some of the plurality of pads may be exposed, so that a threshold voltage, a saturation current, and the like may be measured through the corresponding pads. Hereinafter, an operation of measuring the threshold voltage and the saturation current is referred to as a test operation. For example, a test signal for testing may be supplied from a test apparatus to the plurality of test transistors through one pad of the plurality of pads, and a signal according to the test for the plurality of test transistors may be outputted to the test apparatus through the other one of the plurality of pads.

The semiconductor device 1 according to the embodiment of the present invention may be provided as a semi-finished product in a semiconductor wafer state. Alternatively, the semiconductor device 1 according to the embodiment of the present invention may be provided as a semiconductor package or semiconductor chip processed in a package form by performing a package process in the semi-finished product in the semiconductor wafer state.

Figure 2:
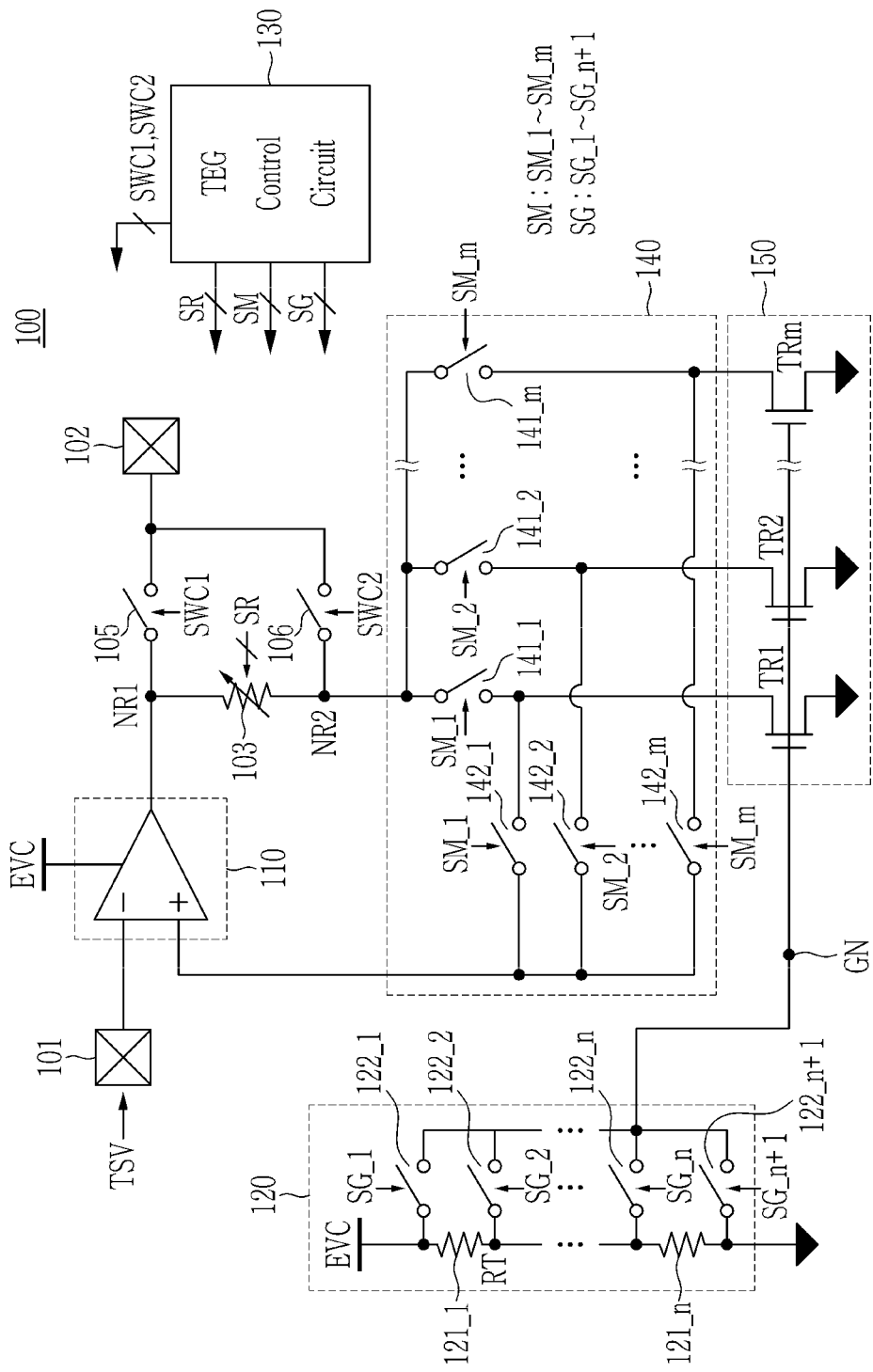
FIG. 2 illustrates a circuit diagram of a TEG circuit in a semiconductor device according to an embodiment.

FIG. 2 illustrates a circuit diagram of a TEG circuit in a semiconductor device according to an embodiment.

A TEG circuit 100 may be formed and positioned inside the semiconductor chip 21. The TEG circuit 100 may include two pads 101 and 102, a variable resistor 103, two switches 105 and 106, an amplifier 110 (e.g., an operational amplifier), a gate driving circuit 120, a TEG control circuit 130, a multiplexer 140, and a device under test (DUT) array 150.

In FIG. 2, the DUT array 150 is illustrated as including an n-channel type of transistor (e.g., n-channel metal-oxide semiconductor field-effect transistor or NMOS device), but this is an example of which the DUT array 150 may include a p-channel type of transistor (e.g., p-channel metal-oxide semiconductor field-effect transistor or PMOS device) or may include n-channel and p-channel types of transistors.

The first pad 101 and the second pad 102 are connected to a test apparatus, so that a predetermined voltage (hereinafter, a test voltage) TSV is supplied from the test apparatus to the first pad 101, and the test apparatus may measure a voltage of the second pad 102. The test apparatus may measure a current flowing through the test transistor by using the voltage measured through the second pad 102.

Figure 3:
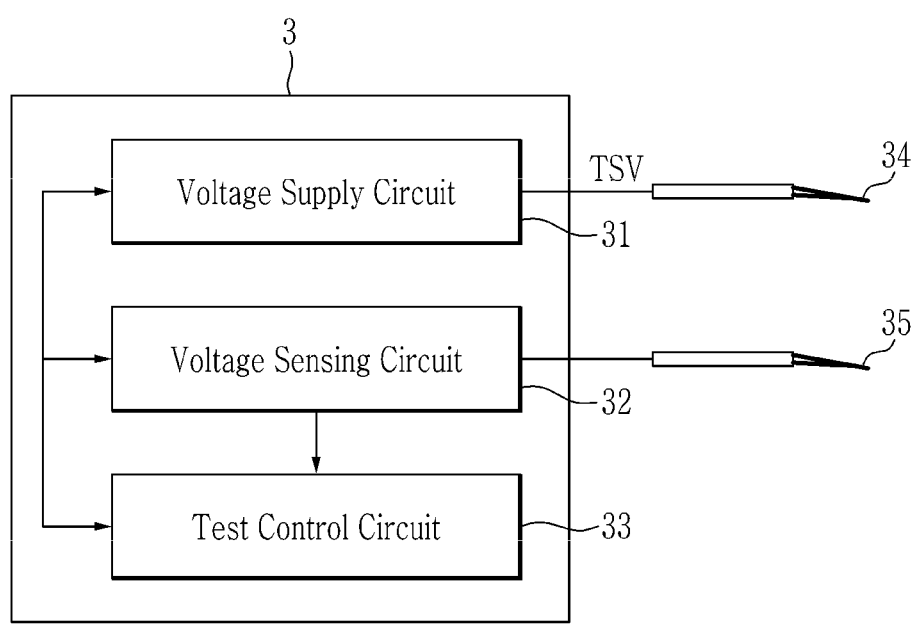
FIG. 3 illustrates a test apparatus for performing a test operation on a TEG circuit according to an embodiment.

FIG. 3 illustrates a test apparatus for performing a test operation on a TEG circuit according to an embodiment.

As shown in FIG. 3, a test apparatus 3 includes a voltage supply circuit 31, a voltage sensing circuit 32, a test TEG control circuit 33, a test prober 34 coupled to the voltage supply circuit 31, and a test prober 35 coupled to the voltage sensing circuit 32. FIG. 3 illustrates the test prober 34 for supplying the test voltage TSV to the first pad 101 of a TEG circuit 200 (see FIG. 5) and the test prober 35 for measuring a voltage of the second pad 102, but this is an example, and the present invention is not limited thereto.

The voltage supply circuit 31 may generate the test voltage TSV to supply it to the test prober 34, and the test prober 34 is in contact with the first pad 101, so that the test voltage TSV may be supplied to the first pad 101. The test prober 35 is in contact with the second pad 102, so that the voltage sensing circuit 32 may measure the voltage of the second pad 102 through the test prober 35.

The test TEG control circuit 33 may control the voltage supply circuit 31 and the voltage sensing circuit 32 to determine the threshold voltage and the saturated current for the test transistor. The test TEG control circuit 33 may control the voltage supply circuit 31 to supply the test voltage TSV to the first pad 101, may control the voltage sensing circuit 32 to measure the voltage of the second pad 102, and may calculate the threshold voltage and the saturated current of the test transistor by using the measured voltage.

Additionally, the voltage supply circuit 31 may supply a power voltage EVC necessary for an operation of the TEG circuit 200. Although not shown in FIG. 3, the power voltage EVC may be supplied to the TEG circuit 100 through a separate power pad provided in the TEG circuit 100.

Referring back to FIG. 2, the amplifier 110 includes two input terminals (+, −) and an output terminal, and may generate an output according to a difference between the two input terminals (+, −). A power voltage EVC necessary for an operation of the amplifier 110 is supplied to the amplifier 110. The input terminal (+) of the amplifier 110 is referred to as a positive or non-inverting input terminal (+), and the input terminal (−) of the amplifier 110 is referred to as a negative or inverting input terminal (−).

A node NR2 is a node connected to the drain of the test transistor of the DUT array 150, and the positive input terminal (+) of the amplifier 110 is connected to the node NR2 through the multiplexer 140. Alternatively, in embodiments wherein the multiplexer 140 is not used (when a single test transistor is present), the positive input terminal (+) of the amplifier 110 may be connected directly to the node NR2 (see, e.g., FIG. 5). In FIG. 2, the DUT array 150 includes an n-channel type of transistor, so the node NR2 is connected to the drain of the test transistor. This is an example for describing the embodiment, and the present invention is not limited thereto. When the test transistor is a p-channel type of transistor, the node NR2 may be connected to the source of the test transistor. In the following description, the 'drain' of the n-channel type of the test transistor may be replaced with the 'source' of the p-channel type of the test transistor.

One terminal of the variable resistor 103 is connected to the output terminal of the amplifier 110 and a node NR1, and the other terminal of the variable resistor 103 is connected to the node NR2. The negative input terminal (−) of the amplifier 110 is connected to the first pad 101, and the output terminal of the amplifier 110 is connected to the node NR1. The variable resistor 103 is connected between the node NR1 and the node NR2, so that the positive input terminal (+) of the amplifier 110 and the output terminal of the amplifier 110 are electrically connected through the multiplexer 140. Then, the voltage of the positive input terminal (+) is adjusted according to a change in the voltage of the output terminal of the amplifier 110 by way of a closed-loop feedback connection arrangement, so that the voltages of the positive input terminal (+) and the negative input terminal (−) may be equally controlled. That is, the amplifier 110 is implemented as a feedback amplifier, and receives the output voltage fed back to the positive input terminal (+) to control the output, thereby controlling the voltage of the positive input terminal (+) by the test voltage TSV inputted to the negative input terminal (−). Since the positive input terminal (+) is connected to the drain of the test transistor and the node NR2, the drain voltage of the test transistor may be controlled by the test voltage TSV applied to the first pad 101.

The voltage of the second pad 102 may depend on the current flowing through the test transistor and the variable resistor 103. The first switch 105 is connected between the second pad 102 and the node NR1, and the second switch 106 is connected between the second pad 102 and the node NR2. The test apparatus 3 (FIG. 3) measures a voltage VR1 of the second pad 102 when the first switch 105 is turned on and the second switch 106 is turned off and a voltage VR2 of the second pad 102 when the first switch 105 is turned off and the second switch 106 is turned on, respectively, so that it may measure a current flowing through the test transistor. For example, a value obtained by dividing a difference (VR1−VR2) between the two voltages by a resistance value of the variable resistor 103 is a value of the current flowing through the test transistor. The TEG control circuit 130 may control the switching operations of the first switch 105 and the second switch 106 in order to measure the current for the test transistor as described above. For example, the TEG control circuit 130 may generate signals SWC1 and SWC2 for controlling the switching operations of the first switch 105 and the second switch 106 to supply them to the first and second switches 105 and 106, respectively.

The TEG control circuit 130 may control the variable resistor 103, the multiplexer 140, and the gate driving circuit 120 to control the test operation for the test transistor. In one or more embodiments, the TEG control circuit 130 reads a test code stored in a memory device of the semiconductor chip 21. The semiconductor chip 21 includes a memory device that stores the test code, and the memory device may have an address. A test code to be changed to the address of the memory device storing the test code in the semiconductor chip 21 may be inputted from the outside, and the test code may be written in the memory device of the semiconductor chip 21.

The TEG control circuit 130 may generate a plurality of resistor selecting signals SR for controlling a value of the variable resistor 103, a plurality of multiplexing signals SM for controlling the multiplexer 140, and a plurality of gate control signals SG for controlling the gate voltage applied to the transistor(s) in the DUT array 150, according to the test code; that is, the test code may include information necessary for setting the test transistor, setting a variable resistor value suitable for the test transistor, and controlling a gate voltage for the test transistor.

Figure 4:
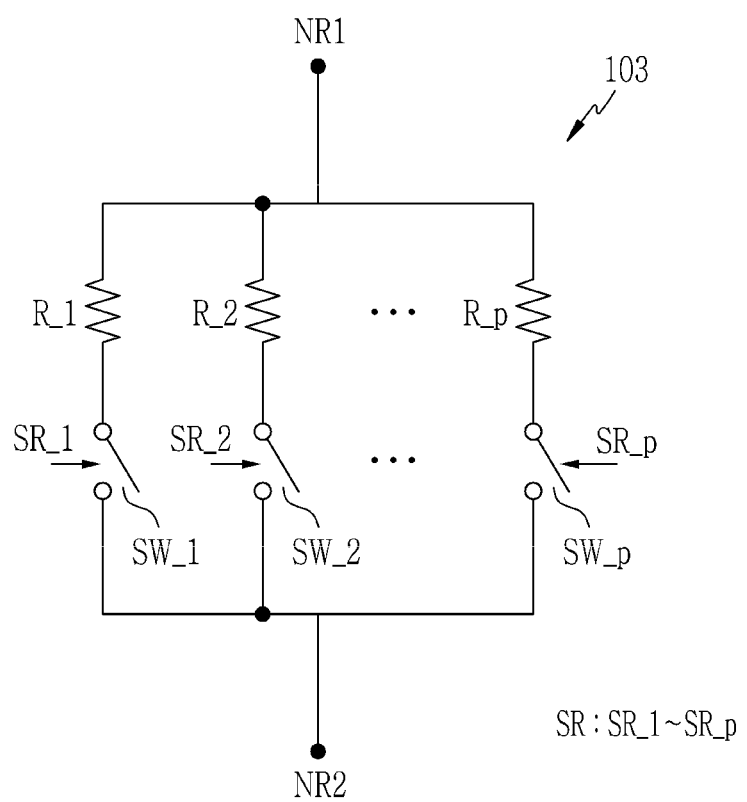
FIG. 4 illustrates a variable resistor according to an embodiment.

FIG. 4 illustrates a variable resistor 103 according to an embodiment.

The variable resistor 103 may include a plurality of resistors R_1 to R_p (p is an integer greater than or equal to 2) and a plurality of switches SW_1 to SW_p connected in series to respectively correspond to the plurality of resistors. Each resistor R_x (x is any number between 1 and p) is connected in series between the node NR1 and the node NR2 together with each corresponding switch SW_x, and the plurality of series resistor-switch combinations (R_x-SW_x) are connected in parallel. The plurality of switches SW_1 to SW_p may perform a switching operation according to a plurality of resistor selecting signals SR_1 to SR_p.

The TEG control circuit 130 may control the variable resistor 103 to have a resistance value suitable for measuring the saturated current of the test transistor. The resistance value of the variable resistor 103 suitable for the test transistor may be based on information included in the test code. For example, the TEG control circuit 130 may select a resistor having a smaller value among the plurality of resistors R_1 to R_p as the saturated current in the test transistor increases, and may turn on a switch connected to the selected resistor among the plurality of switches SW_1 to SW_p. Conversely, the TEG control circuit 130 may select a resistor having a larger value among the plurality of resistors R_1 to R_p as the saturated current in the test transistor decreases, and may turn on a switch connected to the selected resistor among the plurality of switches SW_1 to SW_p. When the value of the variable resistor 103 is small when the saturated current is small, a voltage level measured through the second pad 102 is low, so it is difficult to accurately measure the saturated current. When the value of the variable resistor 103 is large when the saturated current is large, a voltage measured through the second pad 102 may be at an unacceptable level under a condition of the power voltage EVC.

With continued reference to FIG. 2, the multiplexer 140 may operate according to a plurality of multiplexing signals SM_1 to SM_m supplied from the TEG control circuit 130 to connect a selected test transistor in the DUT array 150 and the node NR2. The multiplexer 140 includes a plurality of selection switches 141_1 to 141_m and 142_1 to 142_m (m is an integer greater than or equal to 2), and the plurality of selection switches 141_1 to 141_m and 142_1 to 142_m may perform a switching operation according to the plurality of multiplexing signals SM_1 to SM_m. Each of the plurality of selection switches 141_1 to 141_m is connected between the drain of a corresponding one of the plurality of test transistors TR1 to TRm in the DUT array 150 and the node NR2, and each of the plurality of selection switches 142_1 to 142_m is connected between the drain of a corresponding one of the plurality of test transistors TR1 to TRm and the positive input terminal (+) of the amplifier 110. The drain of the test transistor and the node NR2 may be connected by an enabled (i.e., turned-on) selection switch (for example, 141_i, i is any integer between 1 and m) among the plurality of selection switches 141_1 to 141_m, and the drain of the test transistor and the positive input terminal (+) of the amplifier 110 may be connected by an enabled (i.e., turned-on) selection switch 142_i among the plurality of selection switches 142_1 to 142_m.

The DUT array 150 includes a plurality of test transistors TR1 to TRm. The drain of each of the plurality of test transistors TR1 to TRm is connected to a corresponding selection switch among the plurality of selection switches 141_1 to 141_m and 142_1 to 142_m of the multiplexer 140, and by turning on of the corresponding selection switches (for example, 141_i and 142_i), the drain of the corresponding test transistor TRi may be connected to the node NR2 and the positive input terminal (+) of the amplifier 110. The plurality of test transistors TR1-TRm are transistors including a drain as a first terminal, a source as a second terminal, and a gate as a control terminal, and the present invention is not limited thereto. The DUT array 150 may be configured with a transistor of a different type from that shown in FIG. 2.

The gate driving circuit 120 includes a plurality of series-connected resistors 121_1 to 121_n (n is an integer greater than or equal to 2) and a plurality of corresponding selection switches 122_1 to 122_n+1, and it may generate a plurality of gate voltages by resistor-dividing the power voltage EVC into the plurality of resistors 121_1 to 121_n, and may supply a gate voltage corresponding to a gate node GN through a turned-on selection switch among the plurality of selection switches 122_1 to 122_n. The TEG control circuit 130 may control a switching operation of the plurality of selection switches 122_1 to 122_n+1. The plurality of selection switches 122_1 to 122_n+1 may perform the switching operation according to a plurality of gate control signals SG_1 to SG_n+1 supplied from the TEG control circuit 130. For example, the TEG control circuit 130 may turn on the plurality of selection switches 122_1-122_n+1 in a direction of increasing a gate voltage supplied to the gate node GN.

In the gate driving circuit 120, the plurality of resistors 121_1 to 121_n are connected in series between the power voltage EVC and a ground. A plurality of selection switches 122_2 to 122_n+1 are connected between a plurality of nodes to which two adjacent resistors among the plurality of resistors 121_1 to 121_n are connected and the gate node GN. The selection switch 122_1 is connected between the power voltage EVC and the gate node GN, and the selection switch 122_n+1 is connected between the ground and the gate node GN. When the selection switch 122_n+1 to the switch 122_1 are turned on in the order, the gate voltage supplied to the gate node GN may increase.

Figure 5:
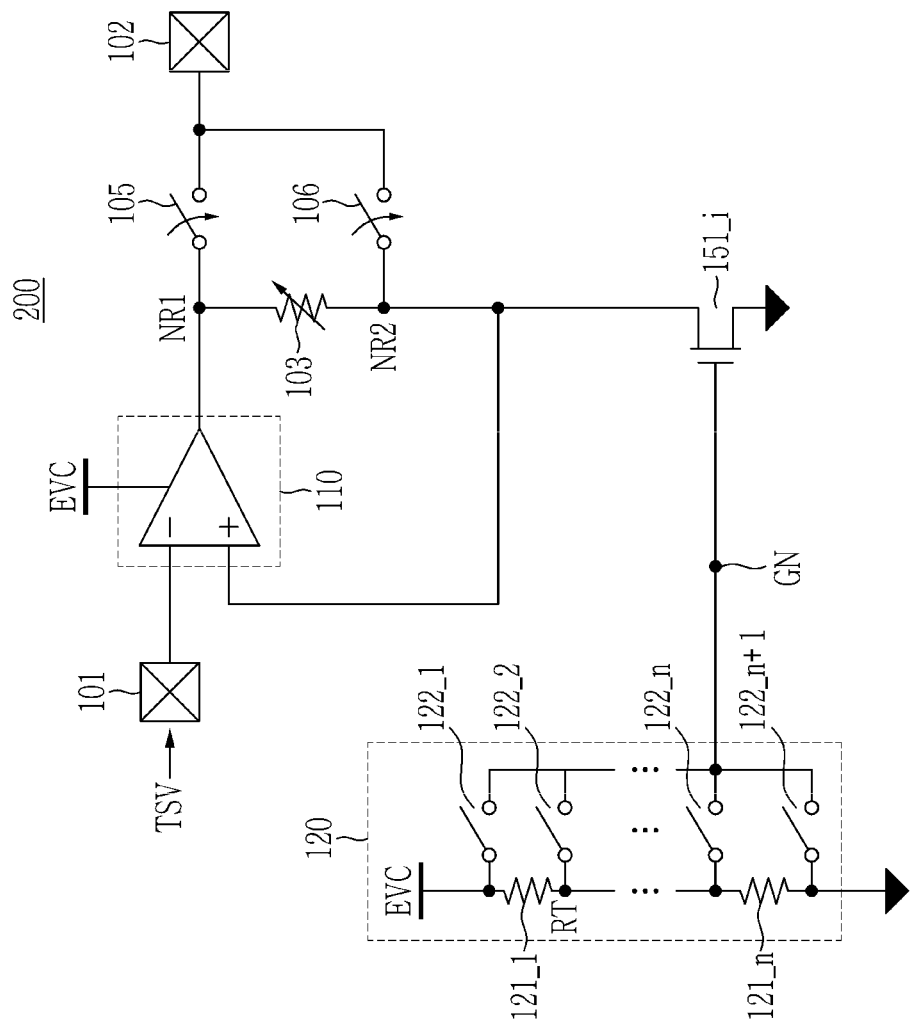
FIG. 5 illustrates a circuit diagram of a TEG circuit during a test operation.

FIG. 5 illustrates a circuit diagram of a TEG circuit during a test operation.

As shown in FIG. 5, a test operation may be performed on a test transistor 151_i, which is a selected one of the plurality of test transistors TR1 to TRm. In this case, the selection switches 141_i and 142_i of the multiplexer 140 (see FIG. 2) are turned on, and the test transistor 151_i may be connected to the node NR2 and the positive input terminal (+) of the amplifier 110. In addition, the resistance value of the variable resistor 103 may have a level at which the saturated current of the test transistor 151_i may be measured. Hereinafter, a test operation for measuring the threshold voltage and the saturated current of the test transistor 151_i by using the TEG circuit 200 shown in FIG. 5 will be described.

When measuring the threshold voltage of the test transistor 151_i, the test voltage TSV of the test transistor 151_i is supplied to the first pad 101, so that the drain voltage of the test transistor 151_i is set as the test voltage TSV of the first pad 101. In this case, the test voltage TSV may be 0.1 V. The gate driving circuit 120 supplies a gate voltage VG to the gate of the test transistor 151_i while changing the gate voltage VG. When the test transistor 151_i is turned on by the gate voltage VG, a current may flow from the power voltage EVC of the amplifier 110 to the test transistor 151_i through the variable resistor 103. A voltage drop occurs at the variable resistor 103 by the current flowing through the test transistor 151_i, so that a voltage difference between the voltage VR1 of the node NR1 and the voltage VR2 of the node NR2 occurs. When the test transistor 151_i is turned off because the gate voltage VG is lower than the threshold voltage, no current flows through the variable resistor 103. When no current flows through the variable resistor 103, the voltage VR1 of the node NR1 and the voltage VR2 of the node NR2 may be the same voltage. The test apparatus 3 may measure the voltage VR1 and the voltage VR2 through the second pad 102, and may divide the difference (VR1−VR2) between the two voltages by the resistance value of the variable resistor 101 to calculate the current value. The test apparatus 3 may determine the threshold voltage of the test transistor 151_i according to the gate voltage VG when the calculated current value is equal to or greater than a predetermined reference value. The reference value may be set as a value for detecting whether a current flows through the test transistor. Since the source of the test transistor 151_i is connected to the ground, the gate voltage VG when the calculated current value is greater than or equal to the predetermined reference value may be determined as the threshold voltage of the test transistor 151_i.

Since the test transistor 151_i is an n-channel type of transistor in this example, the gate voltage may be controlled to increase (e.g., from zero) during the test operation. However, the present invention is not limited thereto, and when the test transistor is a p-channel type of transistor, the gate voltage may be controlled to decrease (e.g., from the power voltage EVC) during the test operation.

Figure 6:
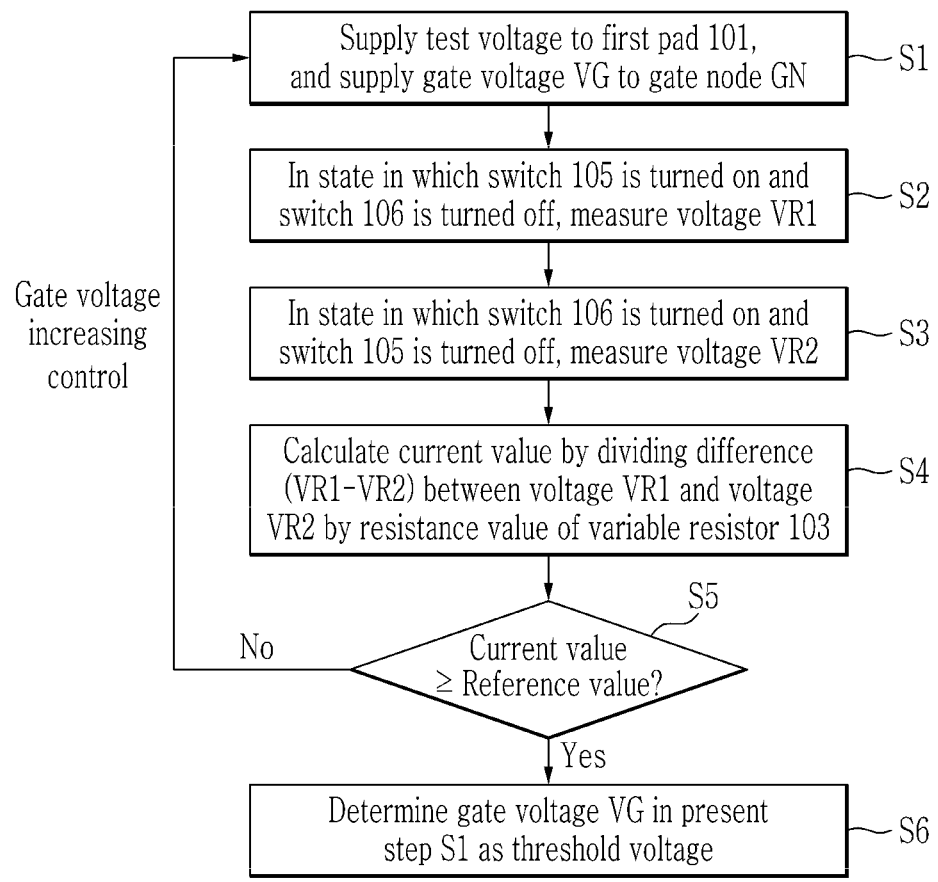
FIG. 6 illustrates a flowchart of a method of measuring a threshold voltage of a test transistor according to an embodiment.

FIG. 6 illustrates a flowchart of a method of measuring a threshold voltage of a test transistor according to an embodiment.

The description with reference to FIG. 6 relates to threshold voltage measurement during a test operation performed on the test transistor 151_i by driving the TEG circuit 200 during a test period. During the test period, the selection switches 141_i and 142_i of the multiplexer 140 (see FIG. 2) are turned on, so that the node NR2 and the positive input terminal (+) of the amplifier 110 may be connected to the drain of the test transistor 151_i, and a test operation for measuring the threshold voltage of the test transistor 151_i may be performed. The operation of the test apparatus 3 may be performed under the control of the test TEG control circuit 33 (see FIG. 3).

First, the test apparatus 3 supplies the test voltage TSV to the first pad 101 and the gate driving circuit 120 supplies the gate voltage VG to the gate node GN (S1).

When the switch 105 is turned on and the switch 106 is turned off, the voltage VR1 of the node NR1 is applied to the second pad 102 and the test apparatus 3 measures the voltage VR1 of the second pad 102 (S2).

When the switch 106 is turned on and the switch 105 is turned off, the voltage VR2 of the node NR2 is applied to the second pad 102 and the test apparatus 3 measures the voltage VR2 of the second pad 102 (S3). The order of step S2 and step S3 may be exchanged with each other.

The test apparatus 3 may derive the difference between the voltage VR1 and the voltage VR2, and may divide the derived difference (VR1−VR2) by the resistance value of the variable resistor 103 to calculate the current value (S4).

The test apparatus 3 may determine whether the current value calculated in step S4 is greater than or equal to the reference value (S5). When no current flows through the test transistor 151_i, no current flows through the variable resistor 103, so no voltage drop occurs between the voltage VR1 and the voltage VR2. Accordingly, when the test transistor 151_i is not turned on, the current value calculated in step S4 may be 0. The reference value is a value for determining whether a current flows through the test transistor 151_i, and may be any value close to 0.

As a result of the determination in step S5, when the current value is smaller than the reference value, it may be repeated again from step S1. That is, the test apparatus 3 may repeat steps S1 to S4 until a current flows through the test transistor 151_i, as measured in step S5. The test apparatus 3 may control the TEG circuit 200 so that the gate voltage VG may be increased in step S1 that is restarted. The TEG control circuit 130 may generate a gate control signal SG for turning on the selection switch connected to a higher voltage than the selection switch turned on in the present step S1 among the plurality of selection switches 122_1 to 122_n+1 so that the gate driving circuit 120 may supply a higher gate voltage VG. For example, when no current flows through the test transistor 151_i when the selection switch 122_k (k is an integer between 1 and n) is turned on in the present step S1, the TEG control circuit 130 may supply a gate control signal SG_k+1 for turning on the selection switch 122_k+1 to the switch 122_k+1 in the next step S1. The test apparatus 3 may transmit an instruction instructing the gate driving circuit 120 to increase the gate voltage VG to the TEG control circuit 130 based on the determination result in step S5.

As a result of the determination in step S5, when the current value is equal to or greater than the reference value, the test apparatus 3 may determine the gate voltage VG in the present step S1 as the threshold voltage of the test transistor 151_i (S6).

The saturated current of the test transistor 151_i may be measured as the current flowing through the test transistor 151_i when the same voltage of a predetermined level is applied to the gate and the drain of the test transistor 151_i. Theoretically, the saturation current means the current flowing through the transistor when the current flowing through the transistor no longer increases even when the drain-source voltage is increased. In the saturated current measurement using the TEG circuit 200, when a voltage of a level based on a condition in which a saturated current may occur in the test transistor 151_j is applied to the gate and the drain, the current flowing through the test transistor may be measured as the saturated current.

The test voltage TSV of the test transistor 151_i is supplied to the first pad 101, so that the drain voltage of the test transistor 151_i is set as the test voltage TSV of the first pad 101. The gate driving circuit 120 may supply the gate voltage VG that is the same as the test voltage TSV to the gate of the test transistor 151_i. In this case, the test voltage TSV may be 1.5 V. The test apparatus 3 may measure the voltage VR1 of the node NR1 and the voltage VR2 of the node NR2 through the second pad 102 to calculate the current flowing through the test transistor 151_i (hereinafter referred to as a drain current) to measure the saturated current.

Figure 7:
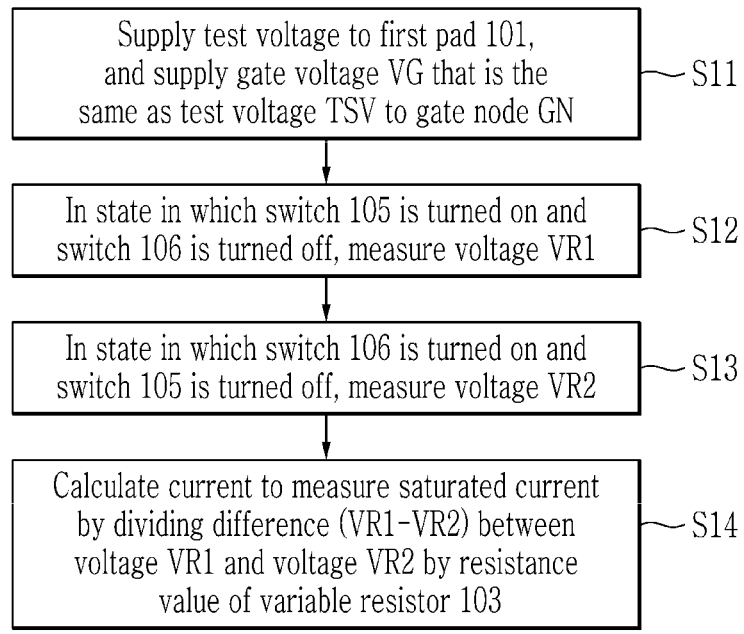
FIG. 7 illustrates a flowchart of a saturated current measurement method according to an embodiment.

FIG. 7 illustrates a flowchart of a saturated current measurement method according to an embodiment.

The description with reference to FIG. 7 relates to saturated current measurement during a test operation performed on the test transistor 151_i by driving the TEG circuit 200 (see FIG. 5) during the test period. During the test period, the selection switches 141_i and 142_j of the multiplexer 140 (FIG. 2) are turned on, so that the node NR2 and the positive input terminal (+) of the amplifier 110 may be connected to the drain of the test transistor 151_i, and a test operation for measuring the saturated current of the test transistor 151_i may be performed.

First, the test voltage TSV is supplied to the first pad 101 from the test apparatus 3, and the gate driving circuit 120 supplies the gate voltage VG that is the same as the test voltage TSV to the gate node GN (S11).

When the switch 105 is turned on and the switch 106 is turned off, the voltage VR1 of the node NR1 is applied to the second pad 102 and the test apparatus 3 measures the voltage VR1 of the second pad 102 (S12).

When the switch 106 is turned on and the switch 105 is turned off, the voltage VR2 of the node NR2 is applied to the second pad 102 and the test apparatus 3 measures the voltage VR2 of the second pad 102 (S13). The order of step S12 and step S13 may be exchanged with each other.

The test apparatus 3 may derive the difference between the voltage VR1 and the voltage VR2, and may divide the derived difference (VR1−VR2) by the resistance value of the variable resistor 103 to calculate the current value and measure the saturated current (S14).

Figure 8:
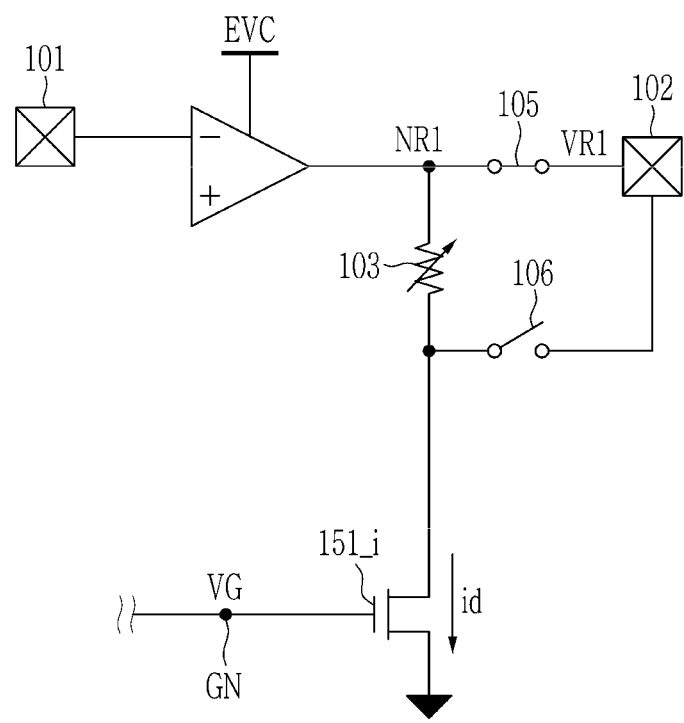
FIG. 8 illustrates a circuit diagram of voltage measurement of a first node through a second pad when a current flows through a variable resistor.

FIG. 8 illustrates a circuit diagram of voltage measurement of a first node through a second pad when a current flows through a variable resistor 103 according to an embodiment.

Figure 9:
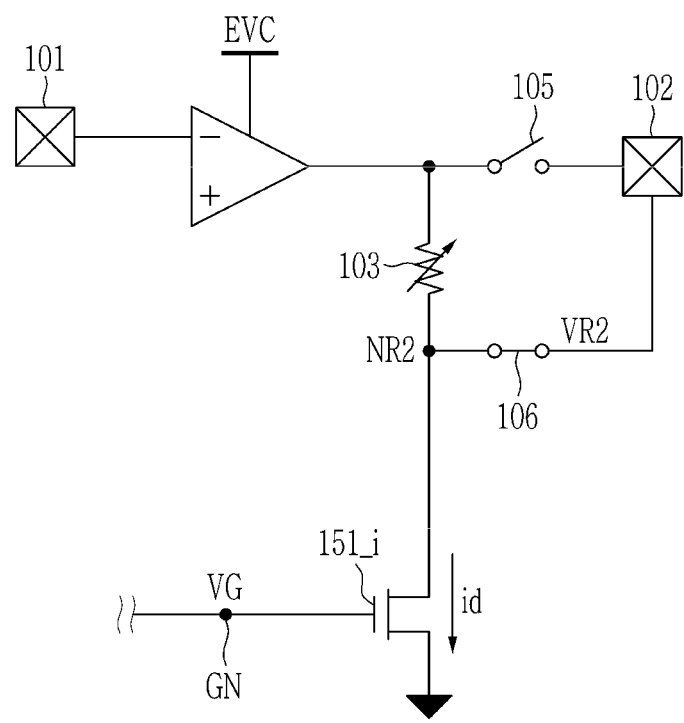
FIG. 9 illustrates a circuit diagram of voltage measurement of a second node through a second pad when a current flows through a variable resistor.

FIG. 9 illustrates a circuit diagram of voltage measurement of a second node through a second pad when a current flows through a variable resistor 103 according to an embodiment.

As shown in FIG. 8 and FIG. 9, a drain current id flows in the test transistor 151_i according to the gate voltage VG applied to the gate node GN.

In the embodiment described above, in step S2 and step S12, the switch 105 is turned on and the switch 106 is turned off. Accordingly, as shown in FIG. 8, the second pad 102 and the first node NR1 are connected, so that the voltage of the second pad 102 is the voltage VR1 of the first node NR1.

In the embodiment described above, in step S3 and step S13, the switch 106 is turned on and the switch 105 is turned off. Accordingly, as shown in FIG. 9, the second pad 102 and the second node NR2 are connected, so that the voltage of the second pad 102 is the voltage VR2 of the second node NR2.

In the previous embodiment, when measuring the saturated current for the test transistor, the gate driving circuit 120 supplies the gate voltage to the test transistor. In contrast, in the driving of the TEG circuit according to an embodiment of the present invention, the gate voltage may be supplied through the first pad 101.

Figure 10:
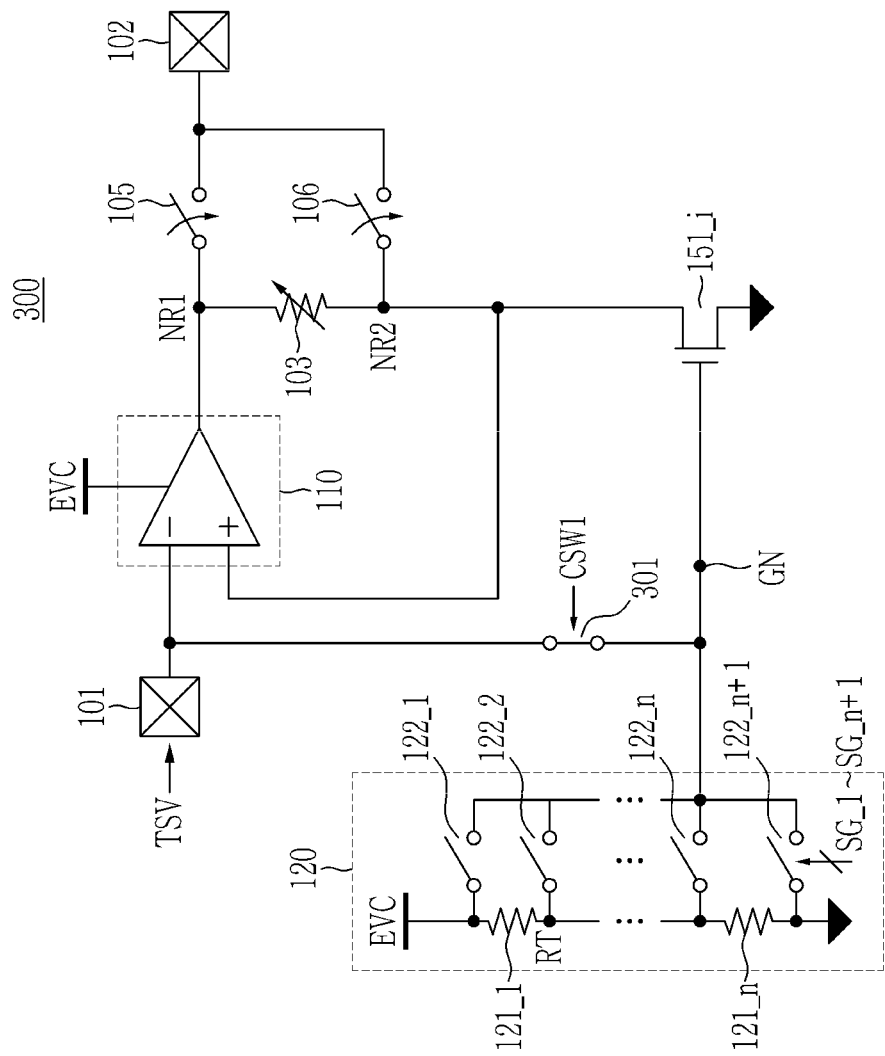
FIG. 10 illustrates a circuit diagram of a TEG circuit according to an embodiment.

FIG. 10 illustrates a circuit diagram of a TEG circuit 300 according to an embodiment.

In FIG. 10, a test operation, for example, saturated current measurement, may be performed on the test transistor 151_i that is one of the plurality of test transistors TR1 to TRm shown in FIG. 2. In this case, the selection switches 141_i and 142_i of the multiplexer 140 are turned on, and the drain of the test transistor 151_i may be connected to the second node NR2 and the positive input terminal (+) of the amplifier 110. Among the configurations of the TEG circuit 300 shown in FIG. 10, a description of the same configuration as that of the TEG circuit 200 of FIG. 5 described above will be omitted. As shown in FIG. 10, the TEG circuit 300 further includes a first connection switch 301 connected between the first pad 101 and the gate node GN.

The TEG control circuit 130 may block the gate voltage supply of the gate driving circuit 120 and turn on the first connection switch 301 when measuring the saturated current for the test transistor 151_i. For example, the TEG control circuit 130 may generate all of the plurality of gate control signals SG_1 to SG_n+1 at a disable level. The plurality of selection switches 122_1 to 122_n+1 are turned off according to the plurality of gate control signals SG_1 to SG_n+1 of the disable level, so that the gate driving circuit 120 does not supply a gate voltage to the gate node GN. The TEG control circuit 130 may generate a signal CSW1 for controlling the switching operation of the first connection switch 301 to supply it to the first connection switch 301. The first connection switch 301 may be turned on by the signal CSW1 of an enable level, and may be turned off by the signal CSW1 of a disable level. When the first connection switch 301 is turned on, the first pad 101 and the gate node GN are connected, so that the test voltage TSV may be supplied to the gate node GN.

The TEG control circuit 130 may control the supply of the gate voltage VG of the gate driving circuit 120 and turn off the first connection switch 301, when measuring the threshold voltage for the test transistor 151_i. A specific method for the TEG control circuit 130 to control the gate driving circuit 120 may be the same as described above.

Figure 11:
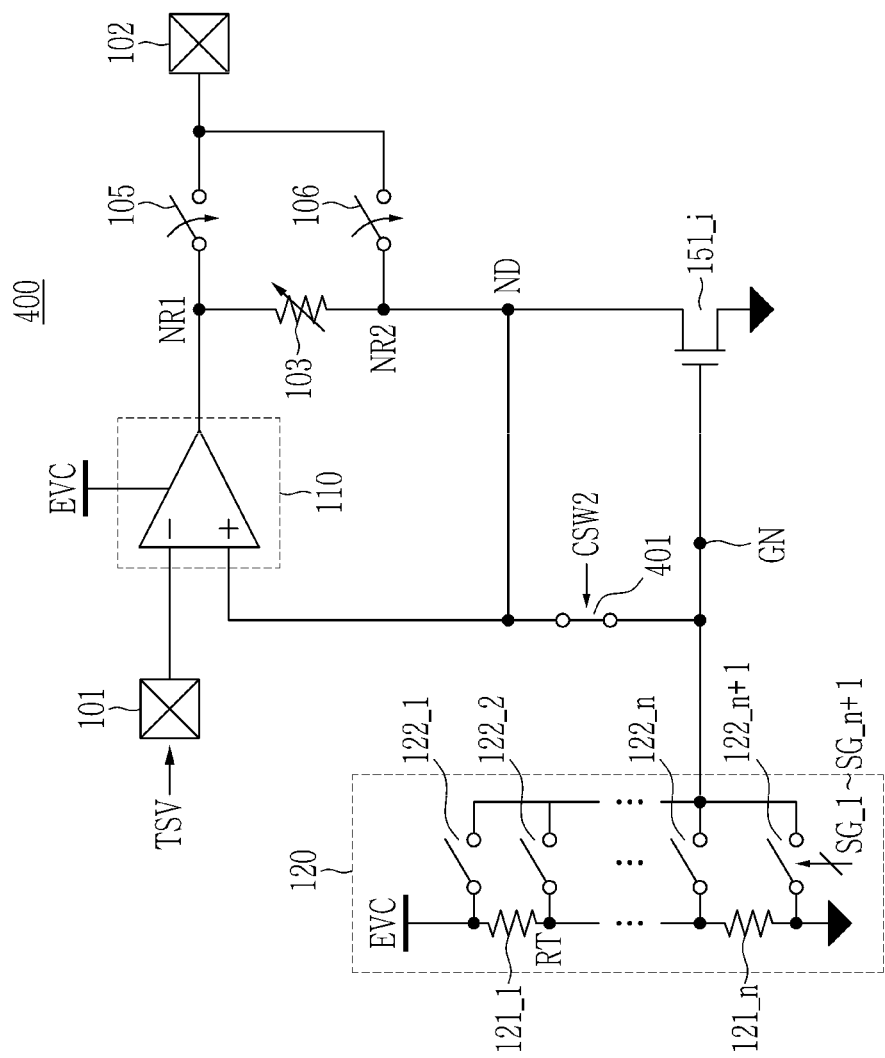
FIG. 11 illustrates a circuit diagram of a TEG circuit according to an embodiment.

FIG. 11 illustrates a circuit diagram of a TEG circuit 400 according to an embodiment.

In FIG. 11, a test operation, for example, saturated current measurement, may be performed on the test transistor 151_i that is one of the plurality of test transistors TR1 to TRm of the DUT array 150 shown in FIG. 2. In this case, the selection switches 141_i and 142_i of the multiplexer 140 are turned on, and the test transistor 151_i may be connected to the second node NR2 and the positive input terminal (+) of the amplifier 110. Among the configurations of the TEG circuit 400 shown in FIG. 11, a description of the same configuration as that of the TEG circuit 200 of FIG. 5 described above will be omitted. As shown in FIG. 11, the TEG circuit 400 further includes a second connection switch 401 connected between the positive input terminal (+) of the amplifier 110 and the gate node GN.

The TEG control circuit 130 may block the gate voltage supply of the gate driving circuit 120 and turn on the second connection switch 401, when measuring the saturated current for the test transistor 151_i. For example, the TEG control circuit 130 may generate all of the plurality of gate control signals SG_1 to SG_n+1 at a disable level. The plurality of selection switches 122_1 to 122_n+1 are turned off according to the plurality of gate control signals SG_1 to SG_n+1 of the disable level, so that the gate driving circuit 120 does not supply a gate voltage to the gate node GN. The TEG control circuit 130 may generate a signal CSW2 for controlling the switching operation of the second connection switch 401 to supply it to the second connection switch 401. The second connection switch 401 may be turned on by the signal CSW2 of an enable level, and may be turned off by the signal CSW2 of a disable level. When the second connection switch 401 is turned on, the test transistor 151_i is connected in a diode arrangement such that the positive input terminal (+) of the amplifier 110 and the gate node GN are connected, so that the test voltage TSV may be supplied to the gate node GN and drain node ND.

The TEG control circuit 130 may control the gate voltage supply of the gate driving circuit 120 and turn off the second connection switch 401, when measuring the threshold voltage for the test transistor 151_i. A specific method for the TEG control circuit 130 to control the gate driving circuit 120 may be the same as described above.

Since the gate driving circuit 120 supplies the resistor-divided voltage as the gate voltage VG by using a plurality of resistors, there may be a limit to the resolution of the gate voltage VG. Since the test voltage TSV applied to the first pad 101 is a continuous value, it may have a higher resolution than the resistor-divided voltages. Accordingly, the resolution of the gate voltage VG may be increased.

In the semiconductor chip 21, the first and second pads 101 and 102 of the TEG circuit 22 may be exposed to the outside. However, the present invention is not limited thereto, and first and second pins electrically connected to the first and second pads 101 and 102 may be pinned out to the outside of the TEG circuit 22. When the first and second pads 101 and 102 are pinned out, an electrostatic discharge (ESD) element may be electrically connected to the first and second pads 101 and 102.

Figure 12:
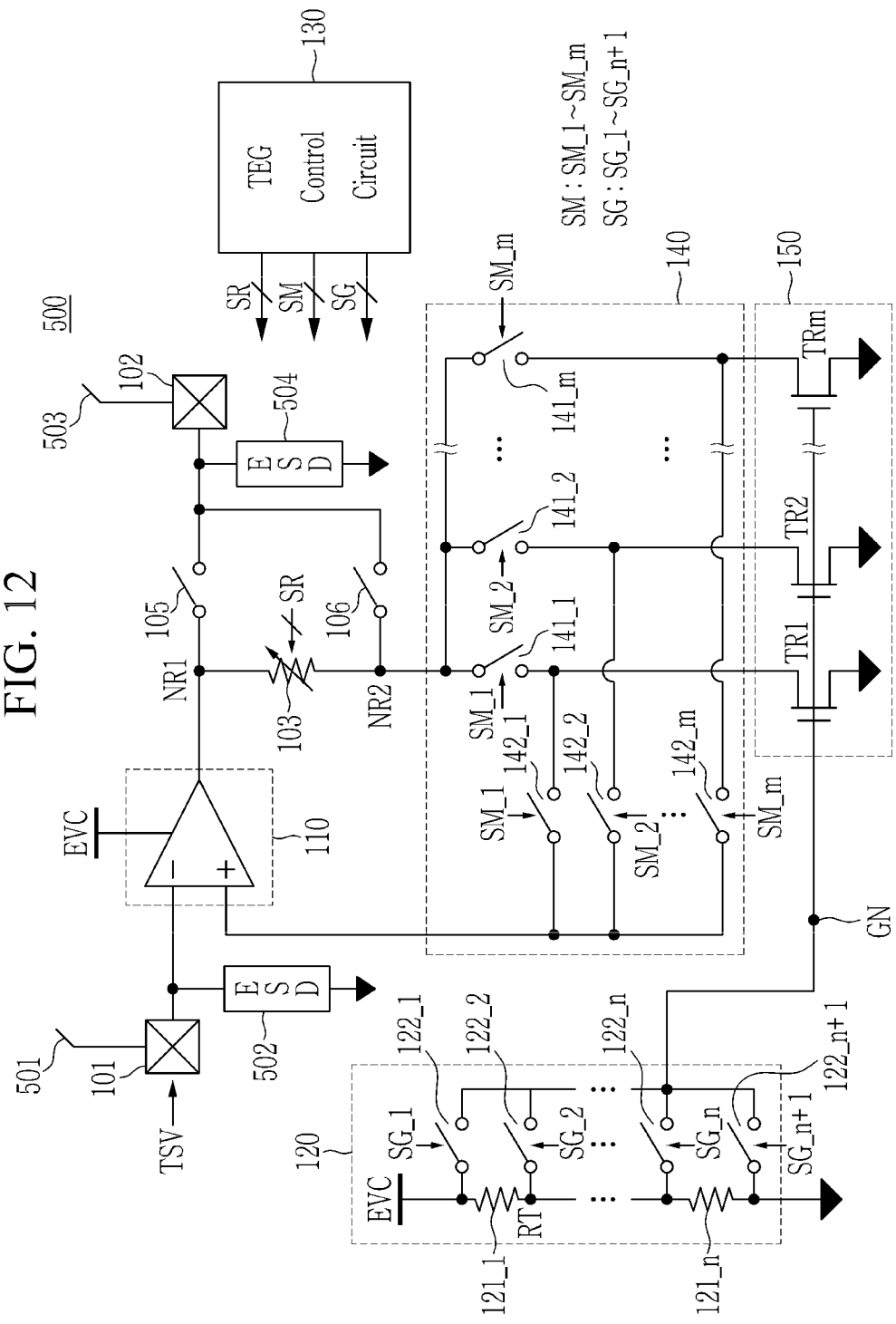
FIG. 12 illustrates a circuit diagram of a TEG circuit including an ESD element according to an embodiment.

FIG. 12 illustrates a circuit diagram of a TEG circuit 500 including an ESD element according to an embodiment.

Contents overlapping with the description of the embodiment of FIG. 2 above will be omitted from the following description.

As shown in FIG. 12, the first pad 101 may be pinned out through a first pin 501, and the second pad 102 may be pinned out through a second pin 503. An ESD element 502 may be connected between the first pad 101 and the ground to discharge static electricity that may be introduced into the TEG circuit 500 through the first pin 501 to the ground. An ESD element 504 may be connected between the second pad 102 and the ground to discharge static electricity that may be introduced into the TEG circuit 500 through the second pin 503 to the ground.

As described above, the embodiment may accurately control the drain voltage of the test transistor and improve the accuracy of measuring the threshold voltage and saturated current for the on-chip transistor. In addition, since a circuit having a large size such as a DAC and an ADC is not included, an area occupied by the TEG circuit in the on-chip may be reduced.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

It will be appreciated that when an element is referred to herein as being "connected" or "coupled" to another element, it can be directly connected or coupled to the other element or intervening elements can be present. In contrast, when an element is referred to as being "directly connected" or "directly coupled" to another element, there are no intervening elements present.

While this invention has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A test element group (TEG) circuit, comprising:
a first pad configured to receive an applied test voltage;
an amplifier including a first input terminal connected to the first pad, a second input terminal connected to a first terminal of a test transistor, and an output terminal operatively coupled to the second input terminal;
a variable resistor including a first terminal connected to the output terminal of the amplifier and a second terminal connected to the first terminal of the test transistor; and
a gate driving circuit that is configured to supply a gate voltage to a gate of the test transistor.

2. The TEG circuit of claim 1, further comprising:
a second pad;
a first switch connected between the first terminal of the variable resistor and the second pad; and
a second switch connected between the second terminal of the variable resistor and the second pad.

3. The TEG circuit of claim 2, wherein
during a period in which the test voltage is applied to the first pad, a difference between a first voltage measured through the second pad when the first switch is turned on and a second voltage measured through the second pad when the second switch is turned on, depends on a current flowing through the test transistor.

4. The TEG circuit of claim 3, wherein
the gate driving circuit is further configured to control the gate voltage applied to the test transistor, and
when a current value obtained by dividing the difference between the first voltage and the second voltage by a resistance value of the variable resistor is equal to or greater than a predetermined reference value due to the change of the gate voltage, the gate voltage is indicative of a threshold voltage of the test transistor.

5. The TEG circuit of claim 3, wherein
when a test voltage of a predetermined level is applied to the first pad and the gate driving circuit supplies the gate voltage of the same level as the test voltage of the predetermined level to the gate of the test transistor, a current value obtained by dividing the difference between the first voltage and the second voltage by a resistance value of the variable resistor is indicative of a saturated current of the test transistor.

6. The TEG circuit of claim 1, wherein
the variable resistor includes:
a plurality of resistors; and
a plurality of switches connected in series respectively corresponding to the plurality of resistors, and
among the plurality of resistors, a switch connected to a selected one of the plurality of resistors is enabled based on an amount of a saturated current of the test transistor.

7. The TEG circuit of claim 1, further comprising
a connection switch connected between the first pad and the gate of the test transistor,
wherein during measurement of the saturated current for the test transistor, the connection switch is enabled, and the gate driving circuit is disabled.

8. The TEG circuit of claim 1, further comprising
a connection switch connected between the second input terminal of the amplifier and the gate of the test transistor,
wherein during measurement of the saturated current for the test transistor, the connection switch is enabled, and the gate driving circuit is disabled.

9. The TEG circuit of claim 1, wherein
the gate driving circuit includes:
a plurality of resistors connected in series between a power voltage and a ground; and
a plurality of selection switches, each of the plurality of selection switches having a first terminal connected to the gate of the test transistor and having a second terminal connected to a unique terminal of a corresponding one of the plurality of resistors.

10. The TEG circuit of claim 1, further comprising:
a second pad selectively connected to the output terminal of the amplifier;
a first pin connected to the first pad;
a second pin connected to the second pad;
a first electrostatic discharge (ESD) element connected between the first pad and the ground; and
a second ESD element connected between the second pad and the ground.

11. A semiconductor device comprising:
a plurality of test transistors;
a first pad configured to receive an applied test voltage;
an amplifier including a first input terminal connected to the first pad, a second input terminal, and an output terminal;
a variable resistor including a first terminal connected to the output terminal of the amplifier;
a multiplexer configured to selectively connect a first terminal of a first test transistor of the plurality of test transistors and the second input terminal of the amplifier, and selectively connecting the first terminal of the first test transistor and a second terminal of the variable resistor; and
a gate driving circuit configured to supply a gate voltage to gates of the plurality of test transistors.

12. The semiconductor device of claim 11, wherein
the multiplexer includes:
a plurality of first selection switches connected between a respective plurality of first terminals of the plurality of test transistors and the second input terminal of the amplifier; and
a plurality of second selection switches connected between the respective plurality of first terminals of the plurality of test transistors and the second terminal of the variable resistor.

13. The semiconductor device of claim 12, wherein
the multiplexer is further configured to enable a first selection switch connected to the first terminal of the first test transistor among the plurality of first selection switches, and is further configured to enable a second selection switch connected to the first test transistor among the plurality of second selection switches.

14. The semiconductor device of claim 11, further comprising a control circuit, wherein
the variable resistor includes:
a plurality of resistors; and
a plurality of switches connected in series respectively corresponding to the plurality of resistors, and
the control circuit is configured to select a first resistor of the plurality of resistors based on an amount of a saturated current of the first test transistor, and is configured to enable a corresponding switch of the plurality of switches connected to the first resistor.

15. The semiconductor device of claim 11, wherein
the gate driving circuit includes:
a plurality of resistors connected in series between a power voltage and a ground; and
a plurality of selection switches, each of the plurality of selection switches having a first terminal connected to the gates of the plurality of test transistors and having a second terminal connected to a unique terminal of a corresponding one of the plurality of resistors.

16. The semiconductor device of claim 15, wherein
the gate driving circuit is configured to control the plurality of selection switches to change the gate voltage applied to the first test transistor, to measure a threshold voltage of the first test transistor.

17. The semiconductor device of claim 15, wherein
the gate driving circuit
is configured to supply the gate voltage that is the same as the test voltage to measure the saturated current of the first test transistor.

18. A test method of a TEG circuit, wherein the TEG circuit includes an amplifier including a first input terminal connected to a first pad, a second input terminal operatively connected to a first terminal of a test transistor, and an output terminal operatively connected to the second input terminal through a variable resistor, the method comprising:

supplying a test voltage to the first pad;

supplying a gate voltage to a gate of the test transistor;

measuring a voltage of a first terminal of the variable resistor connected to the output terminal of the amplifier;

measuring a voltage of a second terminal of the variable resistor connected to the second input terminal of the amplifier; and calculating a current value flowing through the test transistor by dividing a difference between the voltage of the first terminal of the variable resistor and the voltage of the second terminal of the variable resistor by a resistance value of the variable resistor.

19. The test method of the TEG circuit of claim 18, further comprising:

determining whether the calculated current value is greater than or equal to a predetermined reference value;

controlling the TEG circuit to increase the gate voltage when the calculated current value is less than the reference value; and determining the gate voltage of the test transistor as indicative of a threshold voltage of the test transistor when the calculated current value is equal to or greater than the reference value.

20. The test method of the TEG circuit of claim 18, further comprising measuring a saturation current of the test transistor by calculating a current value flowing through the test transistor when the gate voltage is the same as the test voltage.

* * * * *